United States Patent
Iguchi

(10) Patent No.: US 9,716,008 B2
(45) Date of Patent: Jul. 25, 2017

(54) APPARATUS FOR DOPING IMPURITIES, METHOD FOR DOPING IMPURITIES, AND METHOD FOR MANUFACTURING SEMICONDUCTOR DEVICE

(71) Applicant: FUJI ELECTRIC CO., LTD., Kawasaki (JP)

(72) Inventor: Kenichi Iguchi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/094,536

(22) Filed: Apr. 8, 2016

(65) Prior Publication Data

US 2016/0314974 A1 Oct. 27, 2016

(30) Foreign Application Priority Data

Apr. 13, 2015 (JP) ................................. 2015-081813

(51) Int. Cl.
*H01L 21/67* (2006.01)
*H01L 21/228* (2006.01)
(Continued)

(52) U.S. Cl.
CPC .......... *H01L 21/228* (2013.01); *H01L 21/268* (2013.01); *H01L 29/1608* (2013.01)

(58) Field of Classification Search
CPC ............. G03F 7/70341; H01L 21/0455; H01L 21/268; H01L 21/228; H01L 21/2686;
(Continued)

(56) References Cited

U.S. PATENT DOCUMENTS

2007/0242247 A1* 10/2007 Shiraishi ................ G03B 27/42
355/53
2007/0291241 A1* 12/2007 Sakai ..................... G03B 27/42
355/53
(Continued)

FOREIGN PATENT DOCUMENTS

JP 1-313930 12/1989
JP 8-259384 10/1996
(Continued)

OTHER PUBLICATIONS

Ikeda, A. et al., "Phosphorus doping of 4H SiC by liquid immersion excimer laser irradiation", *Applied Physics Letters*, vol. 102, Jan. 2013.
(Continued)

*Primary Examiner* — Jaehwan Oh

(57) ABSTRACT

An apparatus for doping impurities includes: a bath reserving liquid containing impurity elements; a liquid transport device transporting the liquid on a surface of a semiconductor substrate; a laser optical system which scans and irradiates light pulses of laser onto the surface of the semiconductor substrate; an X-Y manipulator moving the semiconductor substrate; and an arithmetic and control unit which controls the liquid transport device and X-Y manipulator. Flow rate of the liquid and scanning velocity of the light pulses are determined, by a characteristic dimension of the irradiation area along the flow direction of the liquid, an overlapping ratio of the irradiation area, and the radius of a bubble generated in the liquid. The impurity elements are doped into a part of the inside of the semiconductor substrate at the determined flow rate and scanning velocity.

12 Claims, 11 Drawing Sheets

(51) Int. Cl.
  *H01L 21/268* (2006.01)
  *H01L 29/16* (2006.01)
(58) Field of Classification Search
  CPC . H01L 21/324; H01L 29/1608; H01L 29/167;
  H01L 29/401
  See application file for complete search history.

(56) References Cited

U.S. PATENT DOCUMENTS

| | | | |
|---|---|---|---|
| 2008/0198347 A1* | 8/2008 | Kawasaki | G03F 7/70916 355/30 |
| 2009/0323035 A1* | 12/2009 | Fujiwara | G03F 7/70066 355/53 |
| 2012/0213166 A1 | 8/2012 | Benveniste | |
| 2016/0005606 A1* | 1/2016 | Nakazawa | H01L 21/0455 438/535 |
| 2016/0247681 A1* | 8/2016 | Ikeda | H01L 21/0455 |

FOREIGN PATENT DOCUMENTS

| | | |
|---|---|---|
| JP | 2005-79299 | 3/2005 |
| JP | 2009-524523 | 7/2009 |

OTHER PUBLICATIONS

Nishi, H. et al., "Phosphorus Doping into 4H-SiC by Irradiation of Excimer Laser in Phosphoric Solution", *Japanese Journal of Applied Physics*, vol. 52, No. 6, Jun. 2013 (Abstract only).

\* cited by examiner

APPARATUS FOR DOPING IMPURITIES, METHOD FOR DOPING IMPURITIES, AND METHOD FOR MANUFACTURING SEMICONDUCTOR DEVICE

CROSS REFERENCE TO RELATED APPLICATIONS AND INCORPORATION BY REFERENCE

This application claims benefit of priority under 35 USC 119 based on Japanese Patent No. P2015-081813 filed Apr. 13, 2015, the entire contents of which are incorporated by reference herein.

BACKGROUND OF THE INVENTION

1. Field of the Invention

The present invention relates to an impurity-doping apparatus, an impurity-doping method, and a semiconductor device manufacturing method.

Semiconductor devices using silicon carbide (SiC), especially 4H silicon carbide (4H—SiC), are being expected as power semiconductor devices. Semiconductor devices of 4H—SiC are typically produced by doping a semiconductor substrate, which includes a 4H—SiC crystalline layer grown epitaxially at a desired concentration, by implantation of impurity element ions such as phosphor (P) ions or aluminum (Al) ions. Specifically, impurity-element ions are accelerated and irradiated onto a semiconductor substrate so as to be implanted into the semiconductor substrate. Then, a process of annealing the semiconductor substrate is performed to recover the crystalline structure of the semiconductor substrate, damaged by the implanted ions, and activate the impurity elements.

In a case when high-dose amount of ions, for example, about $10^{15}/cm^2$ or higher are implanted into a (0001) surface ((000-1) surface) of a 4H—SiC semiconductor substrate, it is necessary to heat the semiconductor substrate in advance so that the temperature of the semiconductor substrate is increased to about 300 to 800° C. If the heating is not executed in advance, recrystallization of 4H—SiC and promoting activation of impurity elements are not effectively achieved.

The annealing of SiC is performed at higher temperature of about 1600 to 1800° C. after implantation. Such high-temperature annealing is known to cause Si atoms to fall off from the lattice structure of SiC at the surface of the semiconductor devices or roughen the surface of the semiconductor devices due to migration. Accordingly, annealing is performed after protection film of aluminum nitride (AlN), carbon (C), or the like is deposited on the surface of the semiconductor devices. However, this increases the number of processes to form and remove the protection film and increases the processing cost. Moreover, there is a risk of contamination from the surroundings due to Al or C.

On the other hand, Ikeda et al. have proposed a doping method as follows: a 4H—SiC semiconductor substrate is immersed in a solution as an aqueous solution containing impurity elements, and an interface region between the surface of the semiconductor substrate and the solution is irradiated with laser light. Accordingly, the semiconductor substrate is locally heated so that the impurity elements in the solution can be doped into the semiconductor substrate. (Ikeda Akihiro, et al., "Phosphorus doping of 4H SiC by liquid immersion excimer laser irradiation", Applied Physics Letters, Vol. 102, 052104-1052104-4, January 2013).

Nishi et al. have proposed another doping method as follows: a 4H—SiC semiconductor substrate is immersed in a solution as an aqueous solution containing impurity elements, and an interface region between the surface of the semiconductor substrate and the solution is irradiated with laser light. Accordingly, the semiconductor substrate is locally heated so that the impurity elements in the solution can be doped into the semiconductor substrate. (Nishi Koji, et al., "Phosphorus Doping into 4H—SiC by Irradiation of Excimer Laser in Phosphoric Solution", JAPANESE JOURNAL OF APPLIED PHYSICS, Vol. 52, No. 6, p 06GF02-1-4, June 2013).

The laser lights used in the methods proposed by Ikeda et al. and Nishi et al. are optical beams of having wavelength in the ultraviolet region, which cause a large absorption coefficient in SiC. According to the techniques of Ikeda et al. and Nishi et al., implantation of the impurity element ions and activation in the semiconductor substrate are simultaneously executed in a low-temperature environment substantially at room temperature. Moreover, it is unnecessary to heat the semiconductor substrate in advance and is also unnecessary to anneal after the implantation of the impurity element ions.

However, when the surface of the semiconductor substrate is repeatedly irradiated with laser light, the irradiated site is locally and instantly heated at high temperature. Accordingly, the liquid or solution component expands, or gas mixed or dissolved in the liquid expands, thus generating bubbles in the solution in some cases. On the other hand, the generated bubbles move in case that the solution is circulated to flow. However, when the bubbles having moved remain in the irradiation target position of laser light at a subsequent irradiation, the laser light at the subsequent shot collides with the bubbles and is not uniformly irradiated onto the semiconductor substrate. Accordingly, laser doping cannot be achieved at desired depth and desired concentration of the impurity elements.

SUMMARY OF THE INVENTION

The present invention was made in the light of the aforementioned problem, and an object of the invention is to provide an impurity-doping apparatus, an impurity-doping method, and a semiconductor device manufacturing method which laser doping can be implemented while preventing bubbles generated by laser light at a prior shot from interfering with the laser light at the subsequent shot.

In order to solve the aforementioned problem, an aspect of the impurity-doping apparatus according to the present invention includes: a liquid reservoir reserving liquid containing impurity elements so that the liquid is in contact with a surface of a semiconductor substrate; a liquid transport device transporting the liquid on the surface of the semiconductor substrate at a fixed flow rate; a laser optical system which scans and irradiates light pulses onto the surface of the semiconductor substrate through the liquid so as to forming the irradiation area having fixed dimensions; an X-Y manipulator freely moving the semiconductor substrate in directions X and Y with the liquid reservoir interposed, the directions X and Y being defined in a plane parallel to the major surface of the semiconductor substrate; and an arithmetic and control unit which controls the liquid transport device and X-Y manipulator and determines flow rate of the liquid and scanning velocity of the light pulses by a characteristic dimension of the irradiation area along the flow direction of the liquid, an overlapping ratio of the irradiation area, and the radius of a bubble generated in the liquid. The liquid is transported at the determined flow rate while moving the semiconductor substrate at the determined scanning velocity, and the impurity elements are doped into a part of the inside of the semiconductor substrate.

Moreover, an aspect of the impurity-doping method according to the present invention includes the steps of: determining flow rate of a liquid and scanning velocity of light pulses, at which a surface of a semiconductor substrate is scanned, by a characteristic dimension of irradiation area of the light pulses irradiated into the liquid containing impurity elements, the characteristic dimension being along a flow direction of the liquid, an overlapping ratio of the irradiation area, and the radius of a bubble generated in the liquid; and transporting the liquid on the surface of the semiconductor substrate at the determined flow rate while scanning and irradiating the light pulses onto the surface of the semiconductor substrate through the liquid at the determined scanning velocity to dope the impurity elements into a part of the inside of the semiconductor substrate.

An aspect of the method for manufacturing a semiconductor device according to the present invention includes the steps of: determining flow rate of a liquid and scanning velocity of light pulses, at which a surface of a semiconductor substrate is scanned, by a characteristic dimension of irradiation area of the light pulses irradiated into the liquid containing impurity elements, the characteristic dimension being along a flow direction of the liquid, an overlapping ratio of the irradiation area, and the radius of a bubble generated in the liquid; and forming a semiconductor region by transporting the liquid on the surface of the semiconductor substrate at the determined flow rate while scanning and irradiating the light pulses onto the surface of the semiconductor substrate through the liquid at the determined scanning velocity to dope the impurity elements into a part of the inside of the semiconductor substrate.

DETAILED DESCRIPTION OF THE INVENTION

Figure 1:
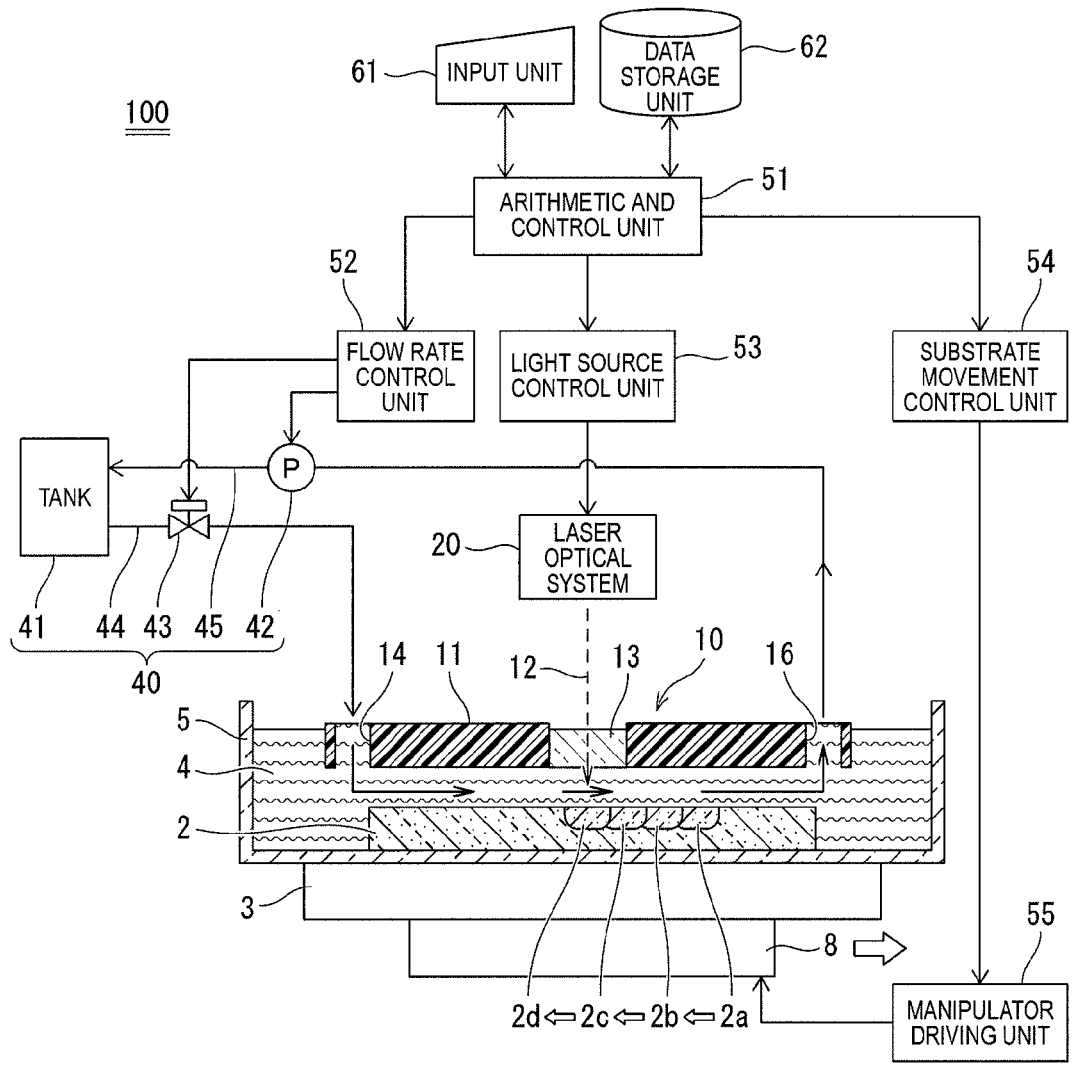
FIG. 1 is a block diagram including a partial cross-sectional view for schematically explaining a rough structure of the impurity-doping apparatus according to the first embodiment of the present invention.

The embodiments of the present invention are explained below. In the description of the drawings below, the same or similar reference numerals are used for the same or similar parts. However, it should be noted that the drawings are schematic, and relations between thicknesses and flat dimensions, ratios of thicknesses in each apparatus and each member, and so on are different from those in reality. Therefore, specific thicknesses and dimensions should be determined in consideration of the explanation below.

Needless to say, relations and ratios of dimensions are partially different among the drawings. In the following explanation, directions expressed as "left and right" and "up and down" are defined only for convenience of explanation, and do not limit the technical ideas of the present invention. Therefore, it is needless to say that when the sheet is rotated by 90 degrees, for example, "left and right" and "up and down" is exchanged with each other when read, and, when the sheet is rotated by 180 degrees, the "left" becomes "right" and "right" becomes "left".

The First Embodiment

—Structure of Impurity-Doping Apparatus—

As illustrated in FIG. 1, an impurity-doping apparatus 100 according to a first embodiment of the present invention includes a bath 5 as a liquid reservoir. The bath 5 reserves liquid 4 containing impurity elements inside so that the liquid 4 is in contact with the surface of a semiconductor substrate 2. The impurity-doping apparatus 100 further includes a liquid transport device 40. The liquid transport device 40 is provided outside the bath 5 and moves the liquid 4 at a fixed flow rate on the surface of the semiconductor substrate 2. The bath 5 is located and supported on the supporting plate 3.

The impurity-doping apparatus 100 further includes a laser optical system 20. The laser optical system 20 scans and irradiates irradiation areas 2a to 2d, which have fixed dimensions, in the semiconductor substrate 2 with respective light pulses of the laser light 12 through the liquid 4. The impurity-doping apparatus 100 further includes an X-Y manipulator 8. The X-Y manipulator 8 freely moves the semiconductor substrate 2 in directions X and Y with the bath 5 interposed. The directions X and Y are defined in a plane parallel to the major surface of the semiconductor substrate 2.

The impurity-doping apparatus 100 further includes an arithmetic and control unit 51, which controls the liquid transport device 40 and X-Y manipulator 8. The arithmetic and control unit 51 determines the flow rate of the liquid 4 and the scanning velocity of light pulses by the characteristic dimension of the irradiation areas 2a to 2d in the flow direction of the liquid 4, the overlapping ratio of the irradiation areas 2a to 2d, and the radius of bubbles generated in the liquid 4. The impurity-doping apparatus 100 moves the liquid 4 at the determined flow rate on the top surface, which is the major surface of the semiconductor substrate 2, at room temperature.

The impurity-doping apparatus 100 scans and irradiates the top surface of the semiconductor substrate 2, which is located in the bath 5, through the liquid 4 with light pulses of the laser light 12 and raises the temperature of the portion irradiated by the laser light 12, so that the impurity elements is introduced into apart of the semiconductor substrate 2. In the impurity-doping apparatus 100 illustrated in FIG. 1, the semiconductor substrate 2, the bath 5, and a supply block 10 are illustrated in a cross-sectional view for explanation.

The case in which the semiconductor substrate 2 is a SiC substrate will be explained by way of example. Specifically, the semiconductor substrate 2 may be a 4H—SiC substrate expected to be used as power semiconductor devices. In the following description, the semiconductor substrate 2 is supposed to include a 4H—SiC crystalline layer formed as an epitaxially grown layer with a predetermined concentration. The crystal plane orientation of the surface of the semiconductor substrate 2 is assigned as (0001) plane or (000-1) plane of 4H—SiC, and then the laser light 12 is irradiated on the top surface of the semiconductor substrate 2, as illustrated in FIG. 1.

The liquid 4 is a solution in which a compound of the impurity elements to be doped into the semiconductor substrate is dissolved. In the impurity-doping apparatus 100 illustrated in FIG. 1, when the impurity elements are phosphor (P)atoms, the liquid 4 can be 85 wt % phosphoric acid ($H_3PO_4$) solution. The impurity-element solution is not limited to phosphoric acid and may be properly another impurity-element solution, which contain another elements such as boron (B), Al, or nitrogen (N).

The liquid 4 can be properly implemented by solutions of compounds of various impurity elements such as: boric-acid ($H_3BO_3$) solution when the impurity element is boron; aluminum chloride ($AlCl_3$) solution when the impurity element is aluminum; and ammonia ($NH_3$) solution when the impurity element is nitrogen. The liquid 4 is not limited to solutions of compound, but needs to be a substance in the form of liquid phase containing impurity elements. For example, the liquid 4 may be impurity elements by themselves in the form of liquid phase, which does not use a solvent.

The bath 5 reserves the liquid 4 inside and supports the semiconductor substrate 2 which is located on the bottom surface of the bath 5. In order to prevent bubbles generated from the top surface of the semiconductor substrate 2 in the liquid 4 by irradiation of the laser light 12 from being sandwiched between the top surface of the semiconductor substrate 2 and the bottom surface of a transmission window 13 described later, the height from the top surface of the semiconductor substrate 2 to the liquid surface of the liquid 4 is determined larger enough than the diameter of the bubbles.

On the other hand, when the height from the top surface of the semiconductor substrate 2 to the liquid surface is excessively large, the laser light 12 attenuates considerably before reaching the top surface of the semiconductor substrate 2. The height is therefore determined to not less than about 0.5 mm and not more than about 5 mm and more preferably not less than about 1 mm and not more than about 3 mm.

The bath 5 is fixed at a predetermined position on the supporting plate 3 so as not to jolt out of the alignment in fall off the supporting plate 3 even when the supporting plate 3 is moved by the X-Y manipulator 8. In the bottom surface of the bath 5, plural alignment marks, which are not illustrated, are formed, for example. The alignment marks are used as irradiation target positions on the bath 5 side, which correspond to the respective irradiation target positions previously determined in the semiconductor substrate 2.

As illustrated in FIG. 1, the supply block 10 is provided within the bath 5 and is located in the liquid surface away from the semiconductor substrate 2. The supply block 10 is supported by a supporting device, which is not illustrated, so that the relative position to the laser optical system 20 is fixed. The supply block 10 includes a substantially rectangular body box 11 and a transmission window 13. The body box 11 implements a recess, which is not labeled by reference numeral, penetrated at the center. The transmission window 13 is horizontally laid within the body box 11 so as to cover the recess.

The transmission window 13 is made of quarts, for example, and transmits the laser light 12. The bottom surface of the transmission window 13 is in close contact with the liquid surface of the liquid 4 and enhances stabilization of the liquid surface, which result in reducing refraction and scattering of the laser light 12. The axis of the recess is parallel to the axis of the laser light 12. The laser light 12 penetrates the transmission window 13 to be irradiated so that the optical axis is orthogonal to the flow direction of the liquid 4, which moves on the top surface of the semiconductor substrate 2. Here, the term of "orthogonal" includes an angle from of about 85 to 95 degrees.

The supply block 10 has lengths in the directions X and Y longer than lengths of the semiconductor substrate 2 in the directions X and Y, respectively. In FIG. 1, the gap between the supply block 10 and the bath 5 in the horizontal direction of FIG. 1 is comparatively small for explanation. The length of the bath 5 in the horizontal direction is in fact determined so as to enable scanning of the entire surface of the semiconductor substrate 2.

At the left side of the rectangle illustrated in FIG. 1, which corresponds to one of two sides facing each other, among four sides of the rectangle implemented by the top surface of the body box 11 of the supply block 10, an injection unit, such as an injection nozzle 14, is provided.

At the right side of the rectangle illustrated in FIG. 1, which corresponds to the other side of the rectangle implemented by the top surface of the body box 11, an evacuation unit, such as an evacuating nozzle 16, is provided. The injection nozzle 14 allows the liquid 4 to be injected into the bath 5, and the evacuating nozzle 16 allows the liquid 4 to be evacuated from the bath 5. Plural injection nozzles having the same structure as the injection nozzle 14 are provided on the same side of the body box 11 as the injection nozzle 14. And, plural evacuating nozzles, which are not illustrated, having the same structure as the evacuating nozzle 16, are provided on the same side of the body box 11 as the evacuating nozzle 16.

The liquid 4 is supplied from the outside of the bath 5 through the injection nozzle 14 into the bath 5 and is sucked through the evacuating nozzle 16 to the outside. The liquid 4 is thus circulated between the supply block 10 and the liquid transport device 40. The liquid 4 moves on the top surface of the semiconductor substrate 2 from the injection nozzle 14 side toward the evacuating nozzle 16 side, between the injection nozzles 14 and evacuating nozzles 16, as indicated by arrows labeled within the liquid 4 in FIG. 1.

The liquid transport device 40 includes a tank 41 reserving the liquid 4 and an injection tube 44, an end of which is connected to the tank 41. In the middle of the injection tube 44, a flow rate regulation valve 43 is provided. The liquid transport device 40 further includes an evacuating tube 45, an end of which is connected to the tank 41. In the middle of the evacuating tube 45, a pump configured to suck the liquid 4 is provided. The other end of the injection tube 44 is connected to the injection nozzle 14 of the supply block 10, and the other end of the evacuating tube 45 is connected to the evacuating nozzle 16. The flow rate regulation valve 43 and pump 42 are both connected to the flow rate control unit.

Because of circulating the liquid 4, each time the shots of the laser light 12 is irradiated for laser doping, the portion of the liquid 4 used in the previous shot is forced away from the irradiation target position of the subsequent shot. And simultaneously, a different portion of the liquid 4 is newly transported over the same position. In other words, during scanning, the region where the liquid 4 contains a constant concentration of the impurity elements is continuously formed over the irradiation target position successively moving.

Although the illustration is omitted, the laser optical system 20 includes a laser light source which irradiates the laser light 12, and a variable slit which shapes the irradiated laser light 12 into a predetermined shape. If necessary for sweeping the laser light 12, a reflection mirror may be provided which reflects and leads the shaped laser light 12 to a light collection device such as a lens, although the illustration of the reflection mirror is omitted. The shaped laser light 12 is irradiated to the interface region between the top surface of the semiconductor substrate 2 and the liquid 4. The laser optical system 20 is connected to a light source control unit 53.

The geometry of the shaped laser light 12 is preferably rectangular in view of scheme for defining an irradiation pattern, by overlapping the irradiation areas formed by successive shots. However, other configurations than the rectangular shape, for example, circular or elliptical shape, are sufficient for practical use when the overlapping ratio is as high as about 0.8 or more. When the overlapping ratio is zero (0), the irradiation area by the previous shot and the irradiation area by the subsequent shot do not overlap at all and are adjacent to each other with no space between the irradiation area by the previous shot and the irradiation area by the subsequent shot.

Figure 6:
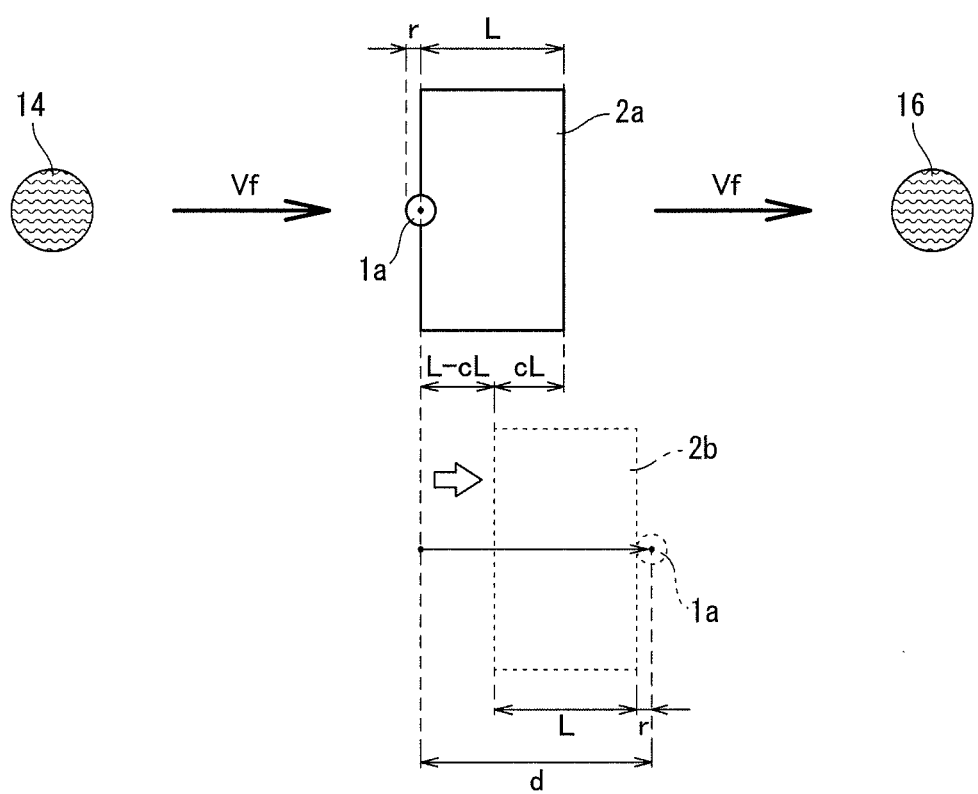
FIG. 6 is a diagram for schematically explaining principle of the impurity-doping method according to the embodiment of the present invention ($\theta=0°$)

When the overlapping ratio is 1, the outline of the irradiation area by the previous shot entirely overlaps the outline of the irradiation area by the subsequent shot. When the irradiation areas are rectangular and the overlapping ratio is 0.5, for example, as illustrated in FIG. 6 which is described afterward, the laser light 12 is irradiated so that the irradiation area by the previous shot overlaps the irradiation area by the subsequent shot by 0.5, which means "a half", the length of a side along the scanning direction.

The laser optical system 20 may be separately provided with a imaging device, such as a CCD camera taking pictures of the alignment marks of the bath 5, a light emitting apparatus emitting illuminating light, a mirror reflecting and transmitting the illuminating light, and an alignment mechanism, or the like, although the illustration is omitted. The laser optical system 20 is preferably designed so as to irradiate the laser light 12 having a wavelength that provides a larger energy than the band-gap energy of the semiconductor substrate 2.

For example, the laser optical system 20 can use a laser light source emitting the laser light 12 in the ultraviolet range, such as a KrF—wavelength is 248 nanometers—laser or ArF—wavelength is 198 nanometers—laser, for example. Excitation with light energy in the ultraviolet region facilitates movement of the impurity elements into interstitial site of 4H—SiC.

The X-Y manipulator 8 supports the bottom of the supporting plate 3 in a horizontal position and is connected to a manipulator driving unit 55. The X-Y manipulator 8 freely moves the bath 5 in X and Y directions in a horizontal plane to freely move the semiconductor substrate 2. Coarse movements in the directions X and Y are driven by a stepping motor, for example. Moreover, magnetic levitation may be used to eliminate friction for achieving accurate movements requiring submicron level position control.

Adding such magnetically levitated precise movements with no frictional force to the coarse movements enables nanometer level position control of the X-Y manipulator 8. The position control can be performed by feeding back the output from a laser interferometer, for example. The manipulator driving unit 55 is connected to the substrate movement control unit 54.

The supporting plate 3 is preferably organized to be further driven in the direction Z, which is vertical to the directions X and Y, in addition to the directions X and Y. For example, a Z-axis manipulator which moves the supporting plate 3 in the direction Z may be provided between the supporting plate 3 and X-Y manipulator 8. When the supporting plate 3 can move along three axes X, Y, and Z so as to drive movement of the bath 5, the semiconductor substrate 2 can be supported and freely moved to a predetermined position corresponding to the irradiation target position of the laser light 12 for scanning. Direct writing architecture on the semiconductor substrate 2 becomes possible, by which desired patterns of the regions where the impurity elements are introduced can be delineated.

Figure 2:
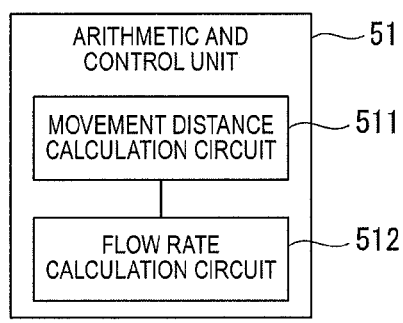
FIG. 2 is a block diagram for schematically explaining a rough structure of an arithmetic and control unit.

The arithmetic and control device 51 includes a bubble movement distance calculation circuit 511 and a flow rate calculation circuit 512 as illustrated in FIG. 2. The arithmetic and control device 51 is connected to the flow rate control unit 52, the light source control unit 53, the substrate movement control unit 54, an input unit 61, and a data storage unit 62 as illustrated in FIG. 1. On the assumption that a bubble is generated only once at each shot of a light pulse of the laser light 12, the bubble movement distance calculation circuit 511 calculates the minimum movement distance that the bubble is forced to move by the liquid 4.

At the calculation, the characteristic length which is the length of irradiation areas measured along the scanning direction and transmitted through the input unit 61, the overlapping ratio, the radius of the bubble, the angle between the scanning direction and the movement direction of the bubble, which is the flow direction, and the repetition frequency of the light pulses are used. The flow rate calculation circuit 512 calculates the minimum value of flow rate Vf of the liquid 4 using the minimum movement distance, repetition frequency, and scanning velocity and determines the flow rate Vf to a value larger than the calculated minimum value.

The determined value of the flow rate Vf is transmitted to the flow rate control unit 52. The flow rate control unit 52 controls the operation of the pump 42 and flow rate adjustment valve 43 so that the liquid 4 moves on the semiconductor substrate 2 at the transmitted value of the flow rate Vf. The characteristic dimension of the irradiation areas and the repetition frequency are transmitted to the light source control unit 53. The light source control unit 53 controls the operation of the laser optical system 20 so that the irradiation of the light pulses can be scanned with the transmitted characteristic dimension of the irradiation areas and repetition frequency.

The overlapping ratio and scanning velocity are transmitted to the substrate movement control unit 54. The substrate movement control unit 54 controls movement operation of the X-Y manipulator 8 so that the transmitted overlapping ratio and scanning velocity can be achieved. The determined value of the flow rate Vf is stored in the data storage unit 62. The arithmetic and control device 51 may be connected to a display device so that the calculated minimum movement distance and the minimum value of the flow rate Vf are displayed, although the illustration of the display device is omitted.

—Impurity-Doping Method—

Next, an impurity-doping method according to the first embodiment of the present invention will be explained. As illustrated in FIG. 1, the semiconductor substrate 2 is located and fixed on the bottom surface of the bath 5. The top surface of the semiconductor substrate 2 is assigned to the opposite side to the supporting plate 3. Next, the laser optical system 20 is moved by predetermined amounts in the directions X and Y so that the position of the alignment mark for the first irradiation target position on the semiconductor substrate 2, where the impurity elements is scheduled to be doped, coincides with the optical axis of the laser light 12.

Next, the liquid 4 is supplied to the bath 5 so that the semiconductor substrate 2 is immersed in the liquid 4, and the liquid 4 is circulated. By supplying the liquid 4, the region where the liquid 4 exists is formed on the top surface of the semiconductor substrate 2, and the liquid 4 moves on the top surface of the semiconductor substrate 2 at a fixed flow rate Vf.

Figure 3:
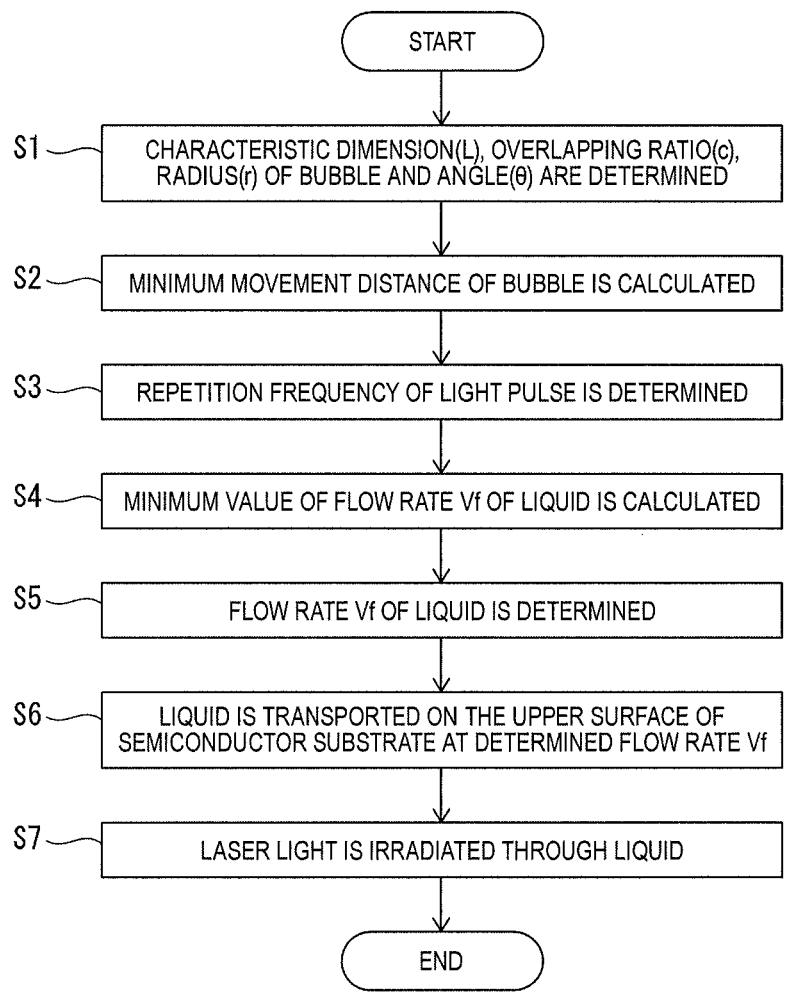
FIG. 3 is a flowchart for explaining the impurity-doping method according to the embodiment of the present invention.

Next, at step S1 in FIG. 3, the characteristic dimension (L) of the irradiation areas 2a to 2d, the overlapping ratio (c) of the irradiation areas 2a to 2d, the radius (r) of a bubble, the angle (θ) between the scanning direction and the flow direction of the liquid 4 are determined. At step S2, the minimum movement distance that a bubble generated from the irradiation area 2a moves between a prior irradiation to the area 2a and a subsequent irradiation to the area 2b is calculated by Eq. (1) using the bubble movement distance calculation circuit 511 in the arithmetic and control device 51.

$$d > L\{1 + \cos\theta(1-c)\} + r \quad (1)$$

The right side of Eq. (1) expresses the minimum movement distance of the bubble and is expanded into "L+L·cos θ(1−c)+r". The first term L from the left among the plural terms of "L+L·cos θ(1−c)+r" can be expressed as 1·L. On the assumption that a bubble is generated from the most upstream position of the irradiation area in the movement direction, the first term L is a term which is determined as an amount in the minimum movement distance necessary for the center of the bubble to move the characteristic dimension L of the irradiation area—which will be defined as "irradiation-area-transport-length term".

By assuming that the bubble is generated from the most upstream position of the irradiation area in the movement direction, it becomes possible reliably to prevent bubbles generated from any positions in the irradiation area 2a formed by previous irradiation with the laser light 12 from interfering with the subsequent irradiation with the laser light 12.

The first term from the left in the right side of Eq. (1) may be determined to an amount (½)·L which is necessary for a bubble to move half the characteristic dimension L of the irradiation area 2a on the limited assumption that bubbles are not generated from the entire surface of the irradiation area 2a and are generated in part substantially concentric to the center of the irradiation area 2a.

Thus, when the value of the irradiation-area-transport-length term of Eq. (1) is changed in such a manner in accordance with the place where bubbles are generated, the minimum movement distance can be further reduced. The minimum movement distance can be therefore flexibly determined in accordance with intended working quality and efficiency of the laser doping.

The part "L·(1−c)" in the second term "L·cos θ(1−c)" from the left in "L+L·cos θ(1−c)+r" indicates the distance between the successive prior irradiation area 2a and subsequent irradiation area 2b, that is, a value which is obtained through modifying scanning movement distance in multiplication of scanning movement distance by the overlapping ratio c per one-time irradiation. Multiplying the scanning movement distance by cos θ produces an effective distance component of the scanning movement distance along the scanning direction. The term L·cos θ(1−c) is a term—scan-distance-transport term—defined as an amount in the minimum movement distance of the bubble necessary for the bubble to pass the scanning movement distance.

Figure 4A:
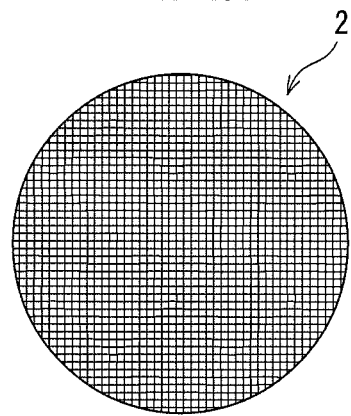
FIG. 4A is a top view schematically illustrating an top surface of a semiconductor substrate in case of irradiation in scanning operation by reciprocating a light pulse between one of scanning directions and the other direction.

In scanning operation by reciprocating the laser light 12 on the top surface of the semiconductor substrate 2 as illustrated in the top view of FIG. 4A, the angle θ during forward scanning is different from that during backward scanning. A white down-pointing arrow illustrated on the upper right side in FIG. 4B indicates one of scanning directions, which is the forward scanning, for example, in reciprocating scanning, and a white up-pointing arrow illustrated on the upper left side indicates the other scanning direction, which is the backward scanning, for example.

Figure 4B:
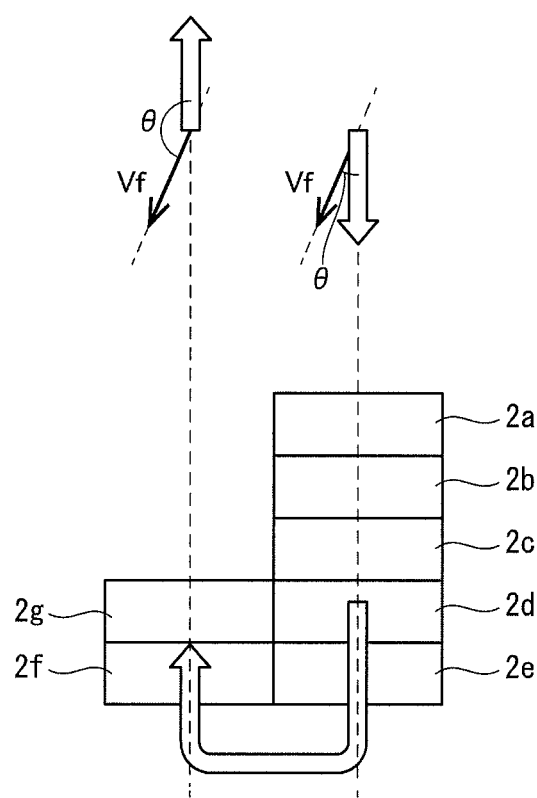
FIG. 4B is a partial enlarged view of FIG. 4A, explaining an angle between a direction of a liquid flow and the scanning direction.

Here, two cases concerning the angle θ would be taken into consideration. One case of the two cases, as illustrated in FIG. 4B, is when five irradiation areas 2a to 2e, which are arranged along the right one of two dashed lines parallel to each other, are formed. The other case is when two irradiation areas 2f and 2g, which are arranged along the left dashed line, are formed. In these two cases, the liquid 4 flows in the same direction, as indicated by a solid arrow, but two values of each angle θ differ during the above processes. Each angle θ is therefore taken into consideration at calculating the minimum movement distance of a bubble.

Figure 5A:
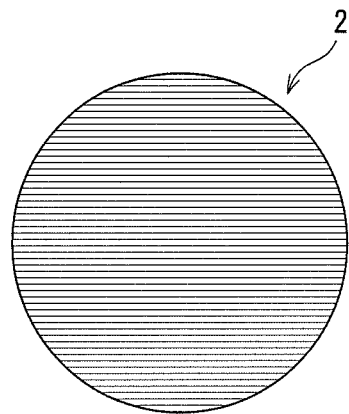
FIG. 5A is a top view schematically illustrating an top surface of a semiconductor substrate in case of irradiation in scanning operation by moving the light pulse only in one direction.
Figure 5B:
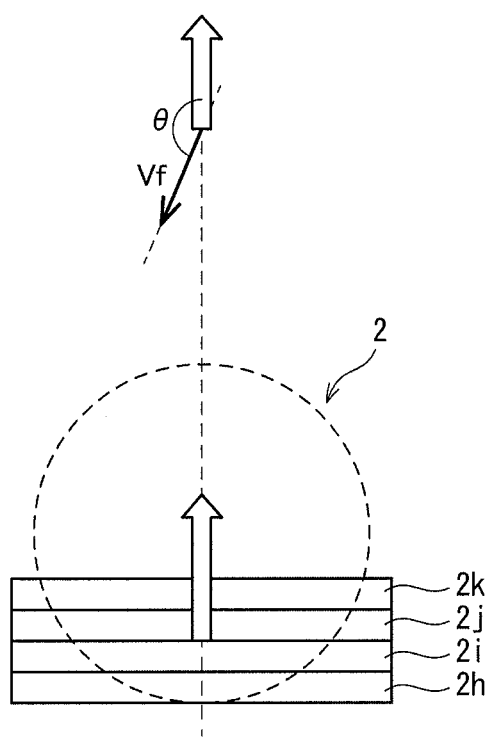
FIG. 5B is a partial enlarged view of FIG. 5A, explaining an angle between a direction of a liquid flow and the scanning direction.

In some cases, the laser light 12 is shaped in an elongated rectangle having a width longer than the width of the semiconductor substrate 2, which corresponds to the length in the horizontal direction in FIG. 4B. In some cases, as illustrated in the top view of FIG. 5A, the thus-shaped laser light 12 could be moved on the top surface of the semiconductor substrate 2 forward only in one direction, not reciprocated, for scanning. In the case illustrates in FIG. 5A, plural irradiation areas 2h to 2k are formed successively in the scanning direction as illustrated in FIG. 5B.

Figure 7:
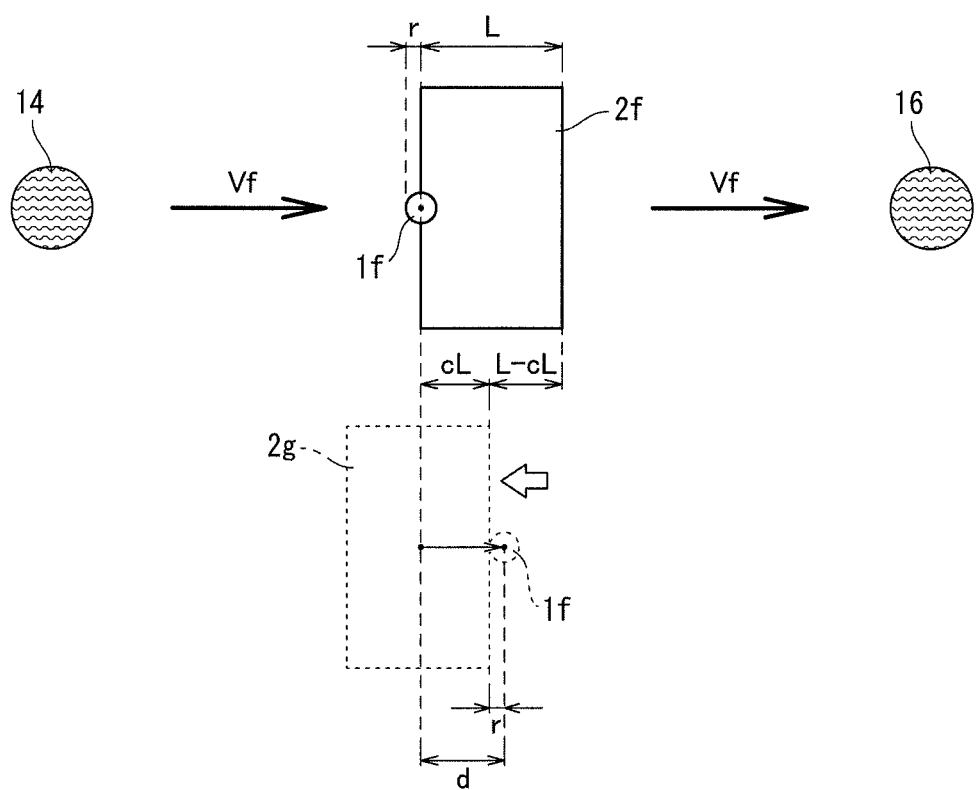
FIG. 7 is a diagram for schematically explaining principle of the impurity-doping method according to the embodiment of the present invention ($\theta=180°$)
Figure 8:
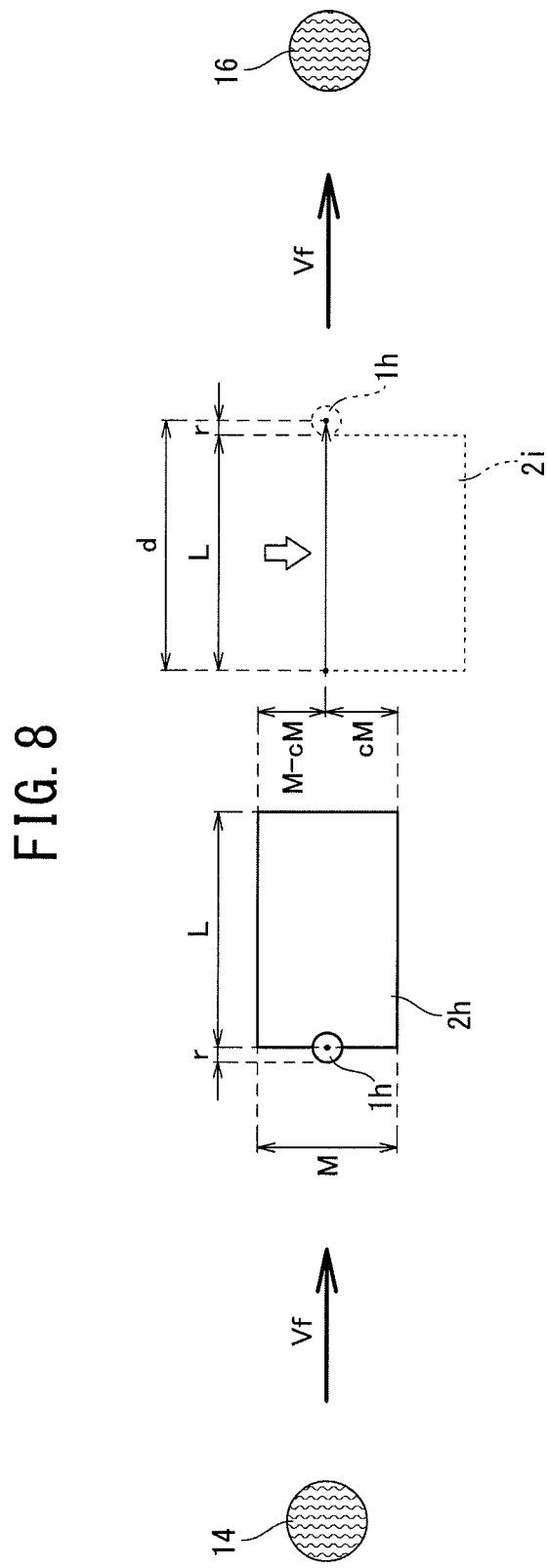
FIG. 8 is a diagram for schematically explaining principle of the impurity-doping method according to the embodiment of the present invention ($\theta=90°$)

The third term "r" from the left in "L+L·cos θ(1−c)+r" in the right side of Eq. (1), is a term defined as an amount in the minimum movement distance of the bubble, which is necessary for the most upstream end of the bubble in the flow direction of the liquid 4 to come out of the irradiation area 2a—an end passage term—. As illustrated in FIGS. 6 to 8, the value of the end passage term is equal to the radius r of a bubble 1a as a distance between the center and edge of the bubble 1a. The radius r of the bubble is suitably determined in a range from several micrometers to about 50 micrometers based on the results of experiments by the inventors.

Next, at step S3 in FIG. 3 the repetition frequency of successive light pulses of the laser light 12 is determined. Repetition period T is expressed as T=1/f where f is the repetition frequency. Using the flow rate calculation circuit 512 of the arithmetic and control device 51, the minimum movement distance calculated by Eq. (1), the repetition period T of the laser light 12 previously determined, scanning velocity Vs, and the angle θ between the scanning direction and the flow direction of the liquid 4 are substituted in Eq. (2). At step S4 in FIG. 3, the minimum value of the flow rate Vf of the liquid 4 is calculated.

$$d=(Vf+Vs\cdot\cos\theta)\cdot T \quad (2)$$

The part "Vf+Vs·cos θ" in the right side of Eq. (2) is the movement velocity Vb of the bubble (Vb=Vf+Vs·cos θ) and indicates that the movement velocity Vb is considered by a combination of the flow rate Vf of the liquid 4 and the scanning velocity Vs.

Here, the movement velocity Vb of the bubble is movement velocity relative to the semiconductor substrate 2 in the direction of the angle θ, and the flow rate Vf and scanning velocity Vs are assumed to be independently defined. In the assumption, relative movement velocity Vb can be used in Eq. (1) and Eq. (2) in either scanning by moving the supporting plate 3 or scanning by moving the laser optical system 20.

The scanning velocity Vs is movement velocity of the irradiation area relative to the top surface of the semiconductor substrate 2. The scanning velocity Vs indicates the movement velocity of the supporting plate 3 moved through the X-Y manipulator 8 or the movement velocity of the laser optical system 20 in the case of scanning by moving the laser optical system 20. The repetition frequency f, which corresponds to "1/T", is about several to several hundred Hz. The pulse width of laser light 12a and 12b is about several tens nanoseconds to several microseconds, which is much shorter than the width of the repetition period T.

Next, at step S5 in FIG. 3, the flow rate Vf of the liquid 4 is determined to a value larger than the minimum value of the flow rate Vf of the liquid 4 obtained by Eq. (2). The flow rate Vf of the liquid 4 is defined as an absolute rate based on the original point outside of the system including coordinates of the movement and driving systems of the bath 5 and semiconductor substrate 2, independently of the coordinate system defining the scanning velocity.

When the flow rate Vf of the liquid 4 is too low, the bubble collides with the laser light 12 at subsequent irradiation as well as a layer of the liquid 4 containing a predetermined concentration of the impurity elements cannot be formed over the next irradiation target position. Therefore the concentration and depth of the impurity elements introduced may be varied.

On the other hand, if the flow rate Vf is too high, minute bubbles, which are far smaller than bubbles generated by irradiation with the laser light 12, are generated in the process of pushing out the liquid 4 from the liquid transport device 40. The minute bubbles are called microbubbles. The microbubbles make the liquid 4 cloudy and the laser doping cannot be performed properly, therefore, the upper limit of the flow rate Vf of the liquid 4 is determined to not more than about 1 m/s.

Next, with reference to FIGS. 6 to 8, the calculation of the minimum movement distance of bubbles and the minimum value of the flow rate Vf is specifically described using three patterns with the angle θ determined to 0°, 180°, and 90°.

(a) θ=0°

In FIG. 6, the flow direction of the liquid 4 is the same as the scanning direction, and the liquid 4 moves from the injection nozzle 14 toward the evacuating nozzle 16, as from left to right illustrated in FIG. 6. The scanning is performed so that the prior irradiation area 2a and the subsequent irradiation area 2b overlap each other with an overlapping ratio c of about 0.5, which means 50%.

For explanation of scanning movement, FIG. 6 illustrates the state of the prior irradiation area 2a which is surrounded by a solid line, and the state of the subsequent irradiation area 2b which is surrounded by a dashed line one above the other. As the characteristic dimension L of the irradiation area 2a, the length of one side of the irradiation area 2a is defined in the flow direction of the liquid 4. When the prior and subsequent irradiation areas 2a and 2b are rectangles, the characteristic dimension may be either the length of the long side or the length of the short side in accordance with the orientation of the rectangle.

The upper part of FIG. 6 illustrates the state where the bubble 1a having the radius r is generated by a prior shot. The center of the bubble 1a is located at the substantially center of the left side in FIG. 6 which is the upstream one in the flow direction of the liquid 4, of the sides of the irradiation area 2a which are orthogonal to the characteristic dimension L. Hereinafter, the sides of the irradiation area 2a which are orthogonal to the characteristic dimension L are referred to as "orthogonal sides".

The lower part in FIG. 6 illustrates the state where the irradiation area 2a has moved toward the evacuating nozzle 16 by a certain distance "L−cL=L·(1−c)". The end on the most upstream side, which is illustrated as the left side in FIG. 6, in the movement direction of the bubble 1a generated by previous irradiation has passed the subsequent irradiation area 2b and does not interfere with the subsequent shot.

In the state illustrated in the lower part of FIG. 6, the center of the bubble 1a is located at a distance of the radius r toward the evacuating nozzle 16, from the substantially center of the right side in FIG. 6 which is the downstream one in the flow direction of the liquid 4, of the sides of the irradiation area 2b which are orthogonal to the sides extending in the flow direction of the irradiation area 2b. In the case of the irradiation area 2a illustrated in FIG. 6, the sides extending along the flow direction are short sides while the orthogonal sides are long sides, and the scanning direction is along the short side. However, scanning may be performed with the long sides set along the flow direction and short sides set orthogonal to the flow direction.

The minimum movement distance that the bubble 1a moves is calculated by substituting cos θ=1 at θ=0° in the right side of Eq. (1):

$$d > L\{1 + \cos\theta(1-c)\} + r = L\{1 + 1 \cdot (1-c)\} + r$$
$$= L(2-c) + r$$

To be specific, the minimum movement distance is the sum of the radius r of the bubble 1a and the length obtained by reducing length cL, which is obtained by multiplying the characteristic dimension L by the overlapping ratio c, from twice the characteristic dimension L of the irradiation areas 2a and 2b.

When cos θ=1 is substituted in Eq. (2), $$d = (Vf + Vs \cdot \cos\theta) \cdot T$$
$$= (Vf + Vs \cdot 1) \cdot T$$
$$= (Vf + Vs) \cdot T$$

The above formula illustrates that the movement velocity Vb of the bubble 1a is the sum of the absolute value of the flow rate Vf of the liquid 4 and the absolute value of the scanning velocity Vs. The minimum value of the flow rate Vf of the liquid 4 when the flow direction of the liquid 4 is the same as the scanning direction is calculated by substituting the previously determined scanning velocity Vs and repetition period T in "(Vf+Vs)·T".

(b) θ=180°

In FIG. 7, the flow direction of the liquid 4 is opposite to the scanning direction, and the liquid 4 moves from the injection nozzle 14 to the evacuating nozzle 16, which is illustrated as from left to right in FIG. 7. Scanning is performed so that the prior irradiation area 2f and the subsequent irradiation area 2g overlap with an overlapping ratio c of 0.5 (50%).

For explanation of scanning movement, FIG. 7 illustrates the state of the prior irradiation area 2f surrounded by a solid line, and the state of the subsequent irradiation area 2g surrounded by a dashed line one above the other, respectively. The characteristic dimension L of the irradiation area 2f is defined in the flow direction of the liquid 4.

The upper part of FIG. 7 illustrates the state where a bubble 1f having the radius r is generated by the prior shot. At the generation timing, the center of the bubble 1f is located at the substantially center of the upstream one, which is illustrated as the left side in FIG. 7, of the two orthogonal sides of the irradiation area 2f in the flow direction of the liquid 4, which corresponds to the side of the injection nozzle 14. The lower part in FIG. 7 illustrates the state where the irradiation area 2f has moved toward the injection nozzle 14 by a certain distance "L−cL=L·(1−c)".

The most upstream end, which is illustrated on the left side in FIG. 7, in the movement direction, of the bubble 1f generated by previous irradiation has passed the subsequent irradiation area 2g and does not interfere with the irradiation area 2g. In the state illustrated in the lower part of FIG. 7, the center of the bubble 1f is located at a distance of the radius r toward the evacuating nozzle 16, from the substantially center of the downstream one in the flow direction of the liquid 4, which is illustrated as the right long side in FIG. 7, of the long sides of the irradiation area 2g.

The minimum movement distance that the bubble 1f moves is therefore calculated by substituting cos θ=−1 at θ=180° in the right side of Eq. (1):

$$d > L\{1 + \cos\theta(1-c)\} + r = L\{1 + (-1) \cdot (1-c)\} + r$$
$$= cL + r$$

To be specific, the minimum movement distance is the sum of the radius r of the bubble 1f and the length cL, which is obtained by multiplying the characteristic dimension L of the irradiation areas 2f and 2g by the overlapping ratio c.

When cos θ=−1 is substituted in Eq. (2), $$d = (Vf + Vs \cdot \cos\theta) \cdot T$$
$$= (Vf + Vs \cdot (-1)) \cdot T$$
$$= (Vf - Vs) \cdot T$$

The above formula illustrates that the movement velocity Vb of the bubble 1f is the difference between the absolute value of the flow rate Vf of the liquid 4 and the absolute value of the scanning velocity Vs. The minimum value of the flow rate Vf of the liquid 4 when the movement direction of the bubble 1f is opposite to the previously set scanning direction is calculated by substituting the scanning velocity Vs and repetition period T in the formula "d=(Vf−Vs)·T".

(c) θ=90°

In FIG. 8, the flow direction of the liquid 4 is orthogonal to the scanning direction and the liquid 4 moves from the injection nozzle 14 to the evacuating nozzle 16, which is illustrated from left to right in FIG. 8. Scanning is performed so that the prior irradiation area 2h and the subsequent irradiation area 2i overlap with an overlapping ratio c of 0.5, which means 50%.

For explanation of scanning movement, FIG. 8 illustrates the state of the prior irradiation area 2h surrounded by a solid line, and the state of the subsequent irradiation area 2i surrounded by a dashed line separately one next to the other. The characteristic dimension L of the irradiation area 2h is defined in the direction of the flow rate Vf of the liquid 4.

The orthogonal sides of the irradiation area 2h having a certain length M are orthogonal to the movement direction of the bubble 1h. In the scanning operation illustrated in FIG. 8, scanning proceeds along the orthogonal sides, and the prior irradiation area 2h and subsequent irradiation area 2i are formed so that the orthogonal sides overlap each other in accordance with the overlap ratio c.

The left part of FIG. 8 illustrates the state where a bubble 1h having the radius r is generated by the prior shot. At the generation timing, the center of the bubble 1h is located at the substantially center of the upstream one, which is illustrated as the left side in FIG. 8, of the two orthogonal sides of the irradiation area 2h in the flow direction of the liquid 4, which corresponds to the side of the injection nozzle 14. The right part in FIG. 8 illustrates the state where the irradiation area 2h has moved downward orthogonally to the movement direction of the bubble 1h by a certain distance "M−cM=M·(1−c)".

The most upstream end, which is illustrated on the left side in FIG. 8, in the movement direction, of the bubble 1h generated by previous shot has passed the subsequent irradiation area 2i and does not interfere with the subsequent shot. In the state illustrated in the right part of FIG. 8, the center of the bubble 1h is situated at a distance of the radius r toward the evacuating nozzle 16, from the corner at the upper end of the downstream one, which is illustrated as the right side in FIG. 8, in the flow direction of the liquid 4, of the two orthogonal sides of the irradiation area 2i.

In the case illustrated in FIG. 8, the scanning direction and the movement direction of the bubble 1h are orthogonal to each other, and the scanning movement distance M·(1−c) between the prior irradiation area 2h and subsequent irradiation area 2i is not included in the minimum movement distance of the bubble 1h. In other words, the minimum movement distance does not depend on the angle θ. The minimum movement distance of the bubble 1h is the sum "L+r" of the characteristic dimension L of the irradiation areas 2h and 2i and the radius r.

That the minimum movement distance is the sum "L+r" is led also by substituting cos θ=0 at θ=90° in the right side of Eq. (1):

$$d > L\{1 + \cos\theta(1 - c)\} + r = L\{1 + 0 \cdot (1 - c)\} + r$$
$$= L + r$$

Accordingly, even when the movement direction of the bubble 1h is orthogonal to the scanning direction, the minimum movement distance can be expressed by Eq. (1) in a similar manner to the cases of θ=0° or 180°.

When cos θ=0 is substituted in Eq. (2), $$d = (Vf + Vs \cdot \cos\theta) \cdot T$$
$$= (Vf + Vs \cdot 0) \cdot T$$
$$= Vf \cdot T$$

The movement velocity of the bubble 1h therefore equals to the flow rate Vf of the liquid 4 independently of the magnitude of the scanning velocity Vs (Vb=Vf). The previously determined repetition period T is substituted in "d=Vf·T" to calculate the minimum value of the flow rate Vf of the liquid 4 when the movement direction of the bubble 1h is orthogonal to the scanning direction.

Figure 9:
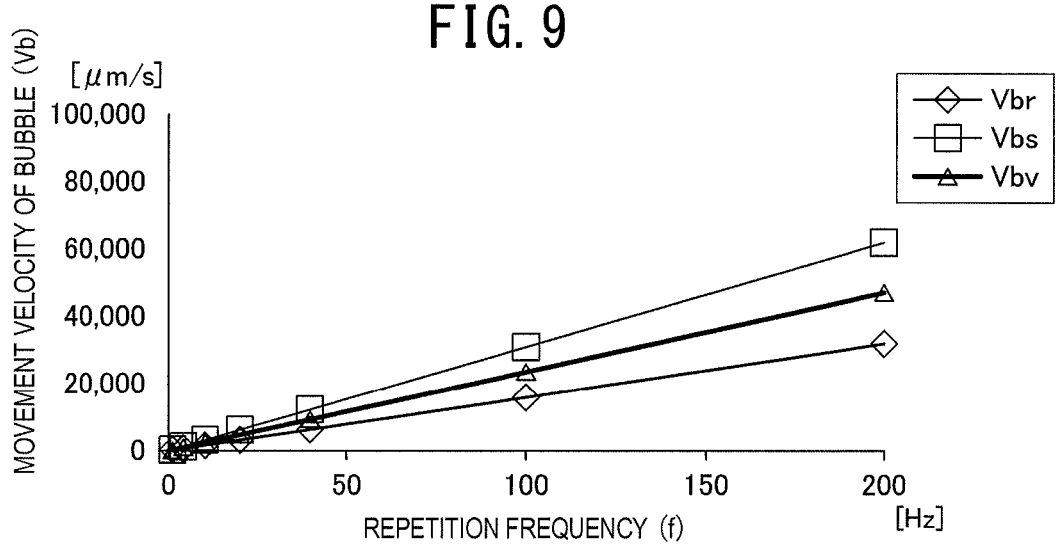
FIG. 9 is a characteristic diagram illustrating a relation between the repetition frequency of the light pulses and the movement velocity of a bubble.

FIG. 9 illustrates the relation between the repetition frequency f of the light pulses and the lower limit of the movement velocity Vb of a bubble when the bubble is not located within the subsequent irradiation area 2b. FIG. 9 illustrates the relation each for three patterns of scanning operation with θ=0°, 180°, and 90° with the fixed scanning velocity Vs.

In any one of the three patterns, the characteristic dimension L of the irradiation areas is about 150 μm, the overlapping ratio c is 0.5, which means 50%, and the radius r of the bubbles 1a, 1f, and 1h is about 15 μm. The gradients of the trajectories of the three lines in FIG. 9 indicate the magnitudes of the minimum movement distances of the bubbles 1a, 1f, and 1h. FIG. 9 illustrates that the lower limits Vbs, Vbr, and Vbv of the bubbles 1a, 1f, and 1h depend on the repetition frequency f.

As illustrated by the trajectory of the plots including data points which are indicated by square symbols, the lower limit Vbs of the bubble 1a is larger when the flow direction of the liquid 4 is the same as the scanning direction (θ=0°) than the lower limits of the other cases (θ=90°, 180°). In the case of θ=0°, the bubble 1a relatively moves in the same direction as the direction that the irradiation area of the laser light 12 moves, and the movement distance of the bubble 1a is short relative to the irradiation area.

That is, even when the bubble 1a moves and leaves from the position where the bubble 1a is generated in the prior irradiation area 2a, the subsequent irradiation area 2b follows the bubble 1a. Accordingly, the bubble 1a has a difficulty to go out of the region occupied by the two irradiation areas 2a and 2b, and the flow rate Vf of the liquid 4 therefore needs to be increased to force the bubble 1a out of the occupied region.

As illustrated by the trajectory of the plots including data points which are indicated by rhombic symbols in FIG. 9, lower limit Vbf of the bubble 1f when the flow direction of the liquid 4 is opposite to the scanning direction (θ=180°) is smaller than the lower limits of the other cases (θ=0°, 90°). In the case of θ=180°, the liquid 4, that is, the bubble 1f relatively moves in the direction opposite to the direction of movement of the region irradiated by the laser light 12 and is therefore more likely to move. The flow rate Vf of the liquid 4 required to force the bubble 1f out of the occupied region therefore can be minimized.

Moreover, even when the repetition frequency f is maximized within the upper limit, or the repetition period T is minimized, the minimum movement distance of the bubble 1f is shorter than the minimum movement distances of the bubbles 1a and 1h (θ=0°, 90°), and the bubble 1f is less likely to be located within the subsequent irradiation target position.

Accordingly, by means that the flow direction of the liquid 5 is set opposite to the scanning direction at one-way scanning as illustrated in FIG. 5B, the laser light 12 can be prevented from colliding with the bubble 1f. It becomes possible to allow the flow rate Vf of the liquid 4 to be minimized or allow the repetition frequency f to be maximized.

On the other hand, when the flow direction of the liquid 4 is set parallel to the scanning direction, in which the angle θ is 0° or 180°, at reciprocating scanning as illustrated in FIG. 4B, to prevent the laser light 12 from colliding with the bubble 1a, 1f, the movement velocity of the bubble needs to be determined larger than the lower limit Vbs of the bubble at θ=0°.

As illustrated by the trajectory of the plots including data points indicated by triangular symbols in FIG. 9, the lower limit Vbv of the flow rate Vf of the liquid 4 at θ=90° is smaller than the lower limit Vbr of the bubble 1f in the case at θ=180°. However, the lower limit Vbr in the case at θ=90° is larger than the lower limit Vbs of the bubble 1a in the case at θ=0°.

Accordingly, by means that the flow direction of the liquid 4 is set orthogonal to the scanning direction at reciprocating scanning, the laser light 12 can be prevented from colliding with the bubble 1h. It becomes possible to minimize the flow rate Vf of the liquid 4 or maximize the repetition frequency f.

Next, at step S6 in FIG. 3, the liquid 4 is transported on the top surface of the semiconductor substrate 2 at the determined flow rate Vf of the liquid 4. For example, as indicated by a right-pointing arrow in FIG. 1, the supporting plate 3 is moved only in the direction X to relatively move the irradiation target position in the direction opposite to the movement direction of the supporting plate 3.

Then, step S7 in FIG. 3, light pulses of the laser light 12 are sweepingly irradiated through the liquid 4 at the determined repetition frequency. Hence, the plural irradiation areas 2a, 2b, 2c, and 2d are formed on the top surface of the semiconductor substrate 2 sequentially in the direction opposite to the movement direction of the X-Y manipulator.

In the case of moving the semiconductor substrate 2 for scanning, the scanning direction, which is illustrated as from right to left, is opposite to the flow direction, which is illustrated as from left to right, of the liquid 4 in FIG. 1. The scanning operation with light pulses of the laser light 12 may be performed in such a manner that the beam of the laser light 12 itself is moved to scan the top surface of the semiconductor substrate 2 by processing of the laser optical system 20 while the semiconductor substrate 2 is fixed. Accordingly, the impurity elements is introduced into a part of the upper area of the semiconductor substrate 2 to directly draw a pattern where the impurity elements is added in the semiconductor substrate 2, thus forming the impurity element-doped region.

—Method for Manufacturing a Semiconductor Device—

Figure 10A:
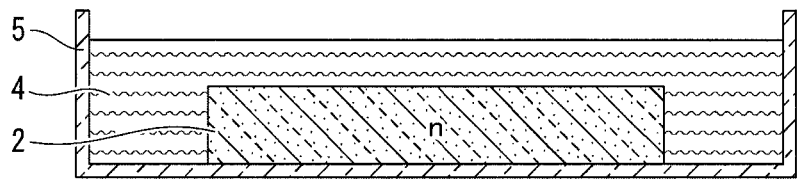
FIG. 10A is a process sectional view for schematically explaining the method for manufacturing the semiconductor device using the impurity-doping method according to the embodiment of the present invention (No. 1)

Semiconductor devices can be manufactured by using the impurity-doping method according to the first embodiment. For example, as illustrated in FIG. 10A, at first, the liquid 4 including the impurity elements is moved such as the liquid 4 flows kept existing on a part of the top surface of the semiconductor substrate 2 of a first or second conductivity type. Herein, the first conductivity type is p-type or n-type, and the second conductivity type is a conductivity type opposite to the first conductivity type. In FIG. 10A, other units exclusive of substrate 2, the liquid 4 and the bath 5, are not illustrated for the purpose of explanation.

Figure 10B:
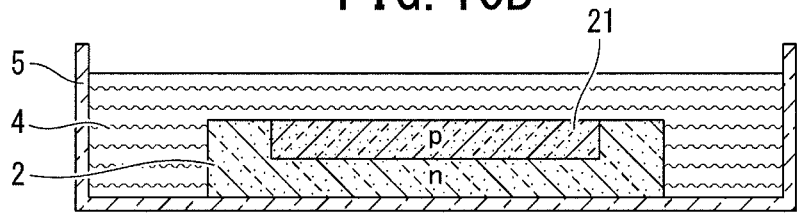
FIG. 10B is a process sectional view for schematically explaining the method for manufacturing the semiconductor device using the impurity-doping method according to the embodiment of the present invention (No. 2)

Next, the top surface of the semiconductor substrate 2 is scanned and irradiated through the liquid 4 with the laser light 12, and as illustrated in FIG. 10B, a semiconductor region of the first conductivity type (p-type or n-type) is formed in upper part of the semiconductor substrate 2. At the time, using the impurity-doping method according to the first embodiment of the present invention, the flow rate Vf of the liquid 4 and the repetition period T at laser doping are determined, and the impurity elements is introduced into the top surface of the semiconductor substrate 2.

Figure 10C:
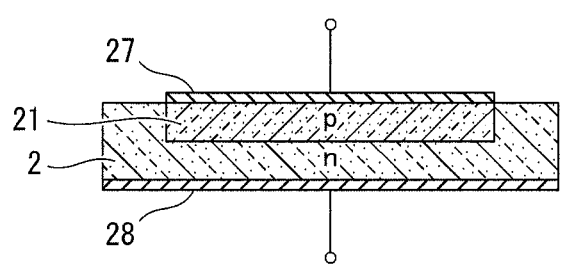
FIG. 10C is a process sectional view for schematically explaining the method for manufacturing the semiconductor device using the impurity-doping method according to the embodiment of the present invention (No. 3)

Then, as illustrated in FIG. 10C, the semiconductor substrate 2 is lifted off from the liquid 4, and processes for activation, e.g. annealing, are performed. Then, the top surface of the semiconductor substrate 2 is joined to a cathode layer 27 as an ohmic contact electrode layer. The bottom surface of the semiconductor substrate 2 is joined to an anode layer 28, thus manufacturing a semiconductor diode device.

Moreover, it is possible to manufacture various types of semiconductor devices, e.g. metal-oxide semiconductor field-effect transistor (MOSFET), insulated gate bipolar transistor (IGBT), by properly changing and combining the type, the concentration, and an irradiation pattern of the impurity elements to be introduced.

Figure 11A:
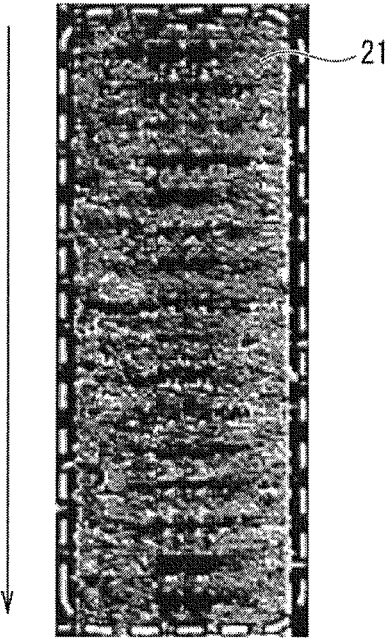
FIG. 11A is a parts of images illustrating states of an top surfaces of the semiconductor device that are obtained by using the impurity-doping method according to the embodiment of the present invention.

FIG. 11A illustrates an image of the state of the top surface of a semiconductor devices manufactured by using the impurity-doping method according to the first embodiment of the present invention, which is taken by an optical microscope. In the method for manufacturing a semiconductor device according to the first embodiment of the present invention, as indicated by a solid arrow in FIG. 11A, the liquid 4 on the top surface of the semiconductor substrate 2 is moved downward in FIG. 11A. Laser doping is performed with the scanning direction set equal to the flow direction ($\theta=0°$) of the liquid 4 so as to form a semiconductor region 21.

At the time, the characteristic dimension L of the irradiation areas, the overlapping ratio c, and the radius r of a bubble are previously determined and are substituted in Eq. (1) together with $\theta=0°$ for calculating the minimum distance that the bubble moves so as to prevent the laser light 12 from colliding with the bubbles. The calculated minimum movement distance is substituted in Eq. (2) together with the previously determined scanning velocity Vs, the repetition period T, and $\theta=0°$ to calculate the minimum value of the flow rate Vf of the liquid 4 at laser doping.

The flow rate Vf is determined to a value larger than the calculated minimum value of the flow rate Vf, and the liquid 4 is transported at the determined value of the flow rate Vf for laser doping. According to the method for manufacturing a semiconductor device according to the first embodiment of the present invention, the semiconductor region 21 can be formed at the predetermined concentration and depth of the impurity elements without the bubble generated from the previous irradiation area prevented from interfering with the laser light 12 irradiated to form the subsequent irradiation area.

COMPARATIVE EXAMPLE

Figure 11B:
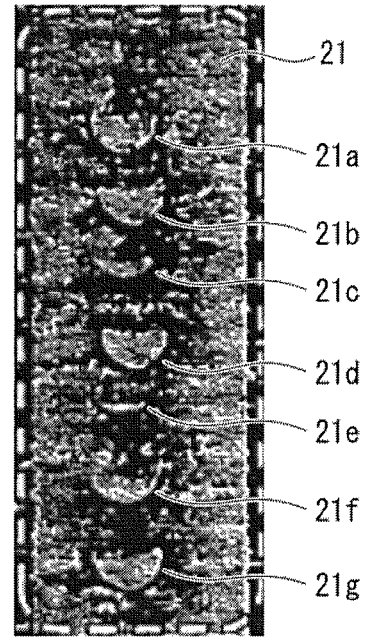
FIG. 11B is a parts of images illustrating states of an top surfaces of the semiconductor device that are obtained by using the impurity-doping method according to a comparative example.

On the other hand, FIG. 11B illustrates the state of the top surface of the semiconductor device manufactured using an impurity-doping method according to a comparative example. In the manufacture of a semiconductor device according to the comparative example, scanning operation is performed with the scanning direction being set equal to the flow direction of the liquid 4 ($\theta=0°$). In the comparative example, the flow rate Vf of the liquid 4 is determined to a value not larger than the minimum value of the flow rate Vf which is determined using Eq. (1) and Eq. (2). The liquid 4 is transported downward, as well as the case illustrated in FIG. 11B, at the determined value of the flow rate Vf in a similar manner to the case of FIG. 11A for laser doping, thus forming the semiconductor region 21.

Figure 12:
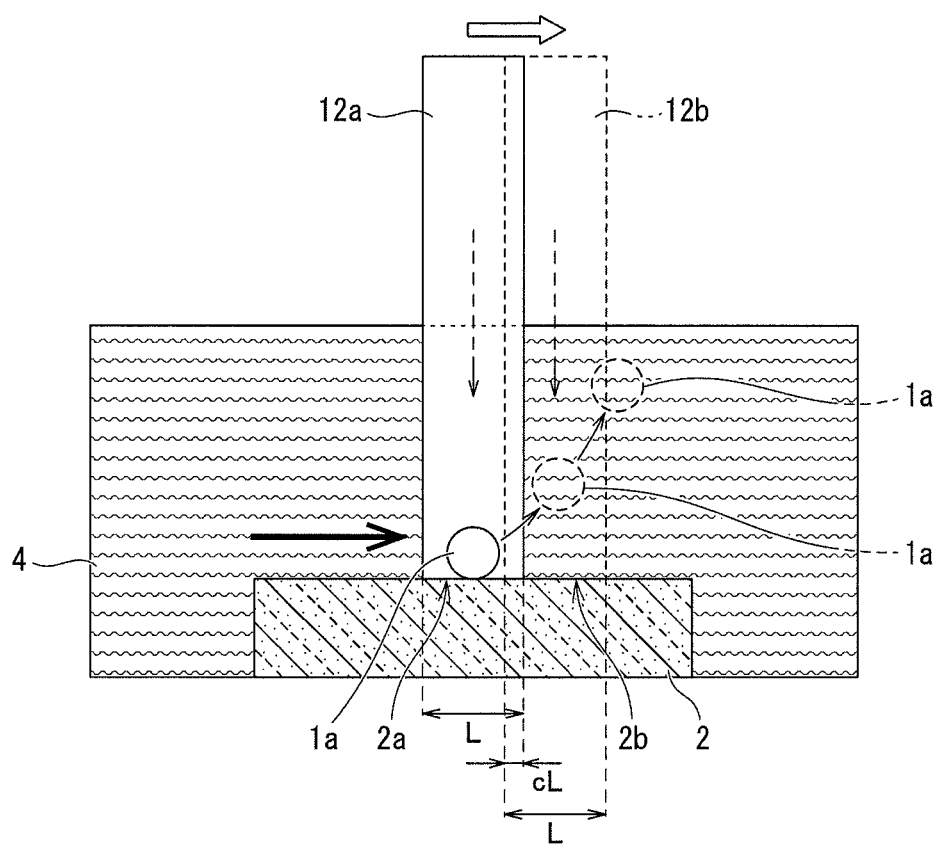
FIG. 12 is a cross-sectional view for schematically explaining states of the interference in a subsequent laser shot, which is caused by a bubble generated through a prior laser shot.

As illustrated in FIG. 12, the bubble 1a generated from the prior irradiation area 2a rises in the liquid 4 while being forced to flow in the flow direction, which is illustrated from left to right, in a solid arrow in FIG. 12 together with movement of the liquid 4. At the time, the bubble 1a moves into the irradiation area of the laser beam 12b, which forms the subsequent irradiation area 2b. Each time the repeatedly irradiated laser light 12 is irradiated after the subsequent laser beam 12b, a bubble generated in the previous irradiation area moves into the region irradiated by the subsequent laser beam.

As illustrated in FIG. 11B, plural circular patterns 21a to 21g are continuously formed, which are evidences of the interference between the bubble 1a and the laser beam 12b. Accordingly, with the method for manufacturing a semiconductor device according to the comparative example, the impurity elements are not introduced at desired concentration and desired depth in the semiconductor region 21.

According to the impurity-doping method according to the first embodiment, the minimum movement distance of the bubble 1a is calculated so that the bubble 1a does not interfere with the subsequent laser beam 12b. In the calculation, the characteristic dimension L of the irradiation areas 2a and 2b by the laser beams 12a and 12b, the overlapping ratio c of the irradiation areas 2a and 2b, the radius r of the bubble 1a generated from the irradiation area 2a, the angle θ between the scanning direction and the movement direction of the bubble 1a, and the repetition period T of the laser beams 12a and 12b are used.

In accordance with the calculated minimum movement distance, the repetition period T, the scanning velocity Vs, and the angle θ, the minimum value of the flow rate Vf of the liquid 4 is calculated, and the flow rate Vf of the liquid 4 is determined to a value larger than the calculated minimum value of the flow rate Vf. The liquid 4 is transported on the surface of the semiconductor substrate 2 at the determined value of the flow rate V for laser doping to introduce the impurity elements into a part of the semiconductor substrate 2. Therefore the bubble 1a generated by the prior laser beam 12a can be prevented from interfering with the subsequent laser beam 12b.

According to the impurity-doping method of the first embodiment, the flow rate Vf of the liquid 4 is determined so as to prevent the subsequent laser beam 12b from colliding with the bubble 1a for laser doping. Accordingly, it is possible to perform desired laser doping while preventing the bubble 1a from interfering with the subsequent laser beam 12b in any one of the patterns where the flow direction of the liquid 4 containing the impurity elements is the same as, opposite to, or orthogonal to the scanning direction. Therefore a device and an operation to change the flow direction of the liquid 4 can be eliminated, and the impurity-doping apparatus 100 can be easily implemented.

Moreover, in laser doping performed with the semiconductor substrate 2 immersed in the liquid 4, the liquid 4 is transported on the top surface of the semiconductor substrate 2a while a comparatively small amount of the liquid 4 is injected from the liquid transport device 40. Accordingly, it is very difficult to perform the control operation precisely to change the flow rate Vf of the transporting liquid 4 greatly during the processing. The flow rate Vf of the liquid 4 is fixed to be a substantially constant value during the processing or is not varied greatly so many times.

According to the impurity-doping method of the first embodiment, even when the scanning direction is changed from the direction opposite to the flow direction of the liquid 4 to the same direction, implementing control of increasing the flow rate Vf of the liquid 4 is unnecessary. Accordingly, by determining the flow rate Vf of the liquid 4 to a fixed value, laser doping can be easily performed even at reciprocating scanning operation.

Moreover, it is not necessary to irradiate the laser beams 12a and 12b, for example, from above diagonally to the flow direction of the liquid 4 for the purpose of preventing interference between the bubble 1a and the subsequent laser beam 12b. The laser beams 12a and 12b can be irradiated in a direction substantially orthogonal to the flow direction of the liquid 4 as illustrated in FIG. 1.

Accordingly, the laser beams 12a and 12b do not attenuate unnecessarily until reaching the top surface of the semiconductor substrate 2. Moreover, it is possible to save the trouble of adjusting the arrangement of the laser optical system 20 so that the laser beams 12a, 12b are irradiated diagonally onto the semiconductor substrate 2. Therefore, the impurity-doping apparatus 100 can be implemented simply, and laser doping can be easily performed.

The Second Embodiment

—Structure of Impurity-Doping Apparatus—

Figure 13:
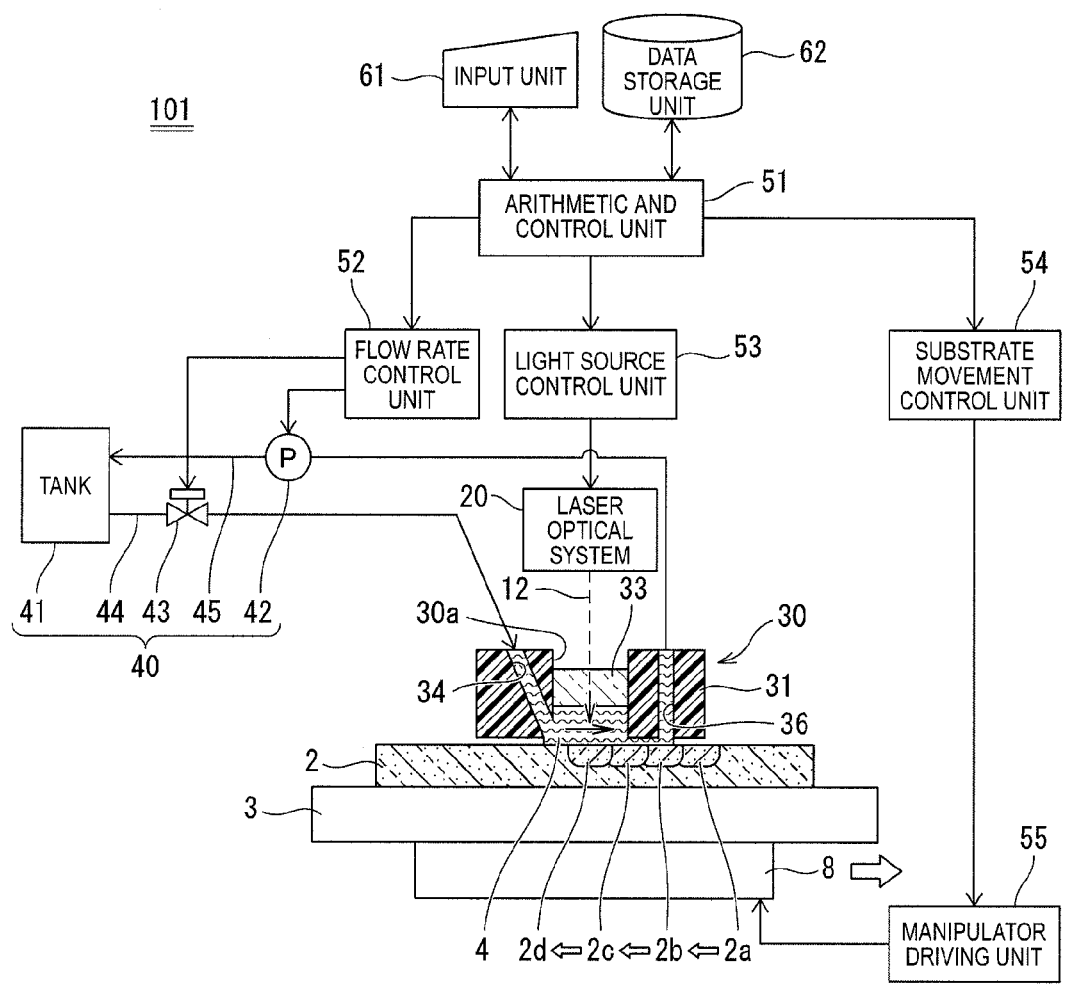
FIG. 13 is a block diagram including a partial cross-sectional view for schematically explaining a rough structure of the impurity-doping apparatus according to the second embodiment of the present invention.

The impurity-doping method according to the present invention may be performed with an impurity-doping apparatus 101 as illustrated in FIG. 13, for example. In the impurity-doping apparatus 100 according to the first embodiment of the present invention, the liquid reservoir, which corresponds to the bath 5, is located on the supporting plate 3, and the semiconductor substrate 2 is immersed in the liquid 4 reserved in the bath 5. The liquid 4 is transported on the top surface of the semiconductor substrate 2 for laser doping by using the supply block 10 located away from the semiconductor substrate 2.

In the case of the impurity-doping apparatus 101 according to a second embodiment of the present invention, the semiconductor substrate 2 is located directly on the supporting plate 3. And, a wall-like block 30 is located on the top surface of the semiconductor substrate 2. The wall-like block 30 serves as the liquid reservoir reserving the liquid 4 inside so that the liquid 4 containing the impurity elements is in contact with the surface of the semiconductor substrate 2.

Using the wall-like block 30, the liquid 4 is localized on the top surface of the semiconductor substrate 2, and is moved on the top surface of the semiconductor substrate 2 within the block 30. The impurity-doping apparatus 101 is different from the impurity-doping apparatus 100 illustrated in FIG. 1 in that the layer of the liquid 4 is locally formed on the top surface of the semiconductor substrate 2 for laser doping instead of immersing the entire semiconductor substrate 2 in the liquid 4.

The wall-like block 30 includes a rectangular shaped body box 31 and a transmission window 33 bridging over body box 31. The body box 31 implements a recess 30a, which penetrates the rectangular space surrounded by the body box 31 at the center. The transmission window 33 is horizontally laid in the body box 31 so as to cover the lower portion of the recess 30a penetrating in the body box 31. The body box 31 has lengths in the directions X and Y shorter than the lengths of the semiconductor substrate 2 in the directions X and Y, respectively. The axis of the recess 30a is parallel to the axis of the laser light 12. The laser light 12 is irradiated through the recess 30a in the direction, which includes about 85 to 95 degrees, substantially orthogonal to the flow direction of the liquid 4 moving on the semiconductor substrate 2.

The body box 31 of the wall-like block 30 is a member with shape of a picture frame of which an outer edge appears in nearly rectangular form in plane pattern at the sight from top view. At one of two sides facing each other of the rectangular shaped body box 31, a feeding canal 34, which allows the liquid 4 to be fed into the insides of the flame comprising the recess 30a, is formed. Plural feeding canals, which is not illustrated, having the same structure as the feeding canal 34 are provided in line on the same side of the body box 31 as the feeding canal 34.

At the opposite to the one side across the recess 30a of the body box 31, an ejecting canal 36, which allows the liquid 4 to be ejected from the recess 30a, is formed. Plural ejecting canals, which are not illustrated such as the case of the feeding canal 34, having the same structure as the ejecting canal 36 are provided in line on the same side of the body box 31 as the ejecting canal 36. A flow path is formed between the feeding canal 34 and the ejecting canal 36.

That is, the liquid 4 is transported along the flow path from one side of the wall-like block 30 on the feeding canal 34 sides toward another side of the ejecting canal 36. The wall-like block 30 moves the liquid 4 supplied from the outside across the irradiation intended position on the top surface of the semiconductor substrate 2 to form the layer of the liquid 4 on the top surface of the semiconductor substrate 2, so that the impurity elements are in contact with the semiconductor substrate 2.

In the recess 30a of the wall-like block 30, the transmission window 33 is provided in a similar manner to the impurity-doping apparatus 100 illustrated in FIG. 1. The laser light 12 is irradiated onto the top of the semiconductor substrate 2 through the transmission window 33 orthogonally to the flow direction of the liquid 4. The gap between the wall-like block 30 and the top surface of the substrate 2 is determined to such a length that the liquid 4 reserved inside the wall-like block 30 will not leak to the outside with surface tension.

The gap is preferably determined to not more than 200 μm when the liquid 4 is 85 wt % phosphoric acid ($H_3PO_4$), for example. The functions of the laser optical system 20, the liquid transport device 40, the arithmetic and control unit 51, and the like constituting the impurity-doping apparatus 101 according to the second embodiment are the same as the devices or the like labeled by the same reference numerals in the impurity-doping apparatus 100 according to the first embodiment illustrated in FIG. 1, and explanation of the laser optical system 20, the liquid transport device 40, the arithmetic and control unit 51, and the like are not described again.

With the impurity-doping apparatus 101 according to the second embodiment, the laser doping is performed with the liquid 4 being localized. Therefore the amount of the liquid 4 for use in laser doping process can be reduced.

Moreover, immersing the entire semiconductor substrate 2 in the liquid 4 is unnecessary. Accordingly, portions unnecessary to be subjected are prevented from being contaminated due to exposure to the liquid 4. Therefore it is possible to omit additional processes for preventing contamination and to increase the flexibility in selecting the materials for the semiconductor substrate 2.

Moreover, the liquid 4 within the wall-like block 30 is circulated using the feeding canal 34 and the ejecting canal 36, and a portion of the liquid 4 is steadily supplied onto the top surface of the semiconductor substrate 2. Accordingly, even at continuous irradiation of the light pulse from laser beam in condition with the liquid 4 being localized, it is possible to reduce variations in doping due to the concentration change or deterioration of the liquid 4, thus performing stable laser doping.

Moreover, the light pulse is irradiated in a direction orthogonally intersecting with the direction of the flow path of the liquid 4. Accordingly, even at laser doping in condition with the liquid 4 being localized, it is possible to introduce the impurity elements effectively.

Moreover, the wall-like block 30 is kept separated from the top surface of the semiconductor substrate 2. Accordingly, it is possible to prevent the wall-like block 10 from coming into contact with the semiconductor substrate 2 and damaging the surface of the semiconductor substrate 2. Moreover, the semiconductor substrate 2 moves smoothly.

—Impurity-Doping Method—

Next, an impurity-doping method according to the second embodiment using the impurity-doping apparatus 101 illustrated in FIG. 13 will be explained. At first, the semiconductor substrate 2 is located and fixed on the top surface of the supporting plate 3 with the top surface facing the side opposite to the supporting plate 3 as illustrated in FIG. 13.

Next, the laser optical system 20 is moved by predetermined amounts in the directions X and Y so that the position of an alignment mark in accordance with the irradiation target position on the semiconductor substrate 2 where the impurity elements are doped coincides with the optical axis of the laser light 12.

Next, the liquid 4 is supplied into the recess 30a of the wall-like block 30 to form a region where the liquid 4 exists, at the top surface of the semiconductor substrate 2. Then, the liquid 4 is moved from the feeding canal 34 sides to the ejecting canal 36 sides at the fixed flow rate Vf to be circulated between the inside and outside of the wall-like block 30 through the liquid transport device 40. Light pulses of the laser light 12 are sweepingly irradiated at a fixed repetition frequency f onto the target position for irradiation on the semiconductor substrate 2, thus forming an irradiation area with the impurity elements doped under the irradiated position.

In FIG. 13, four irradiation areas 2a, 2b, 2c, and 2d are illustrated being sequentially formed on the top surface of the semiconductor substrate 2. The laser optical system 20 and the wall-like block 30 are fixed in each position relatively. The X-Y manipulator 8, the supporting plate 3, and the semiconductor substrate 2 are fixed in each position relatively. As illustrated by an white arrow in right direction in FIG. 13, every time when the X-Y manipulator 8 moves step-by-step from left side to right side in FIG. 13, the laser light 12 is irradiated onto the semiconductor substrate 2. That is, the laser light 12 is moved in the direction opposite to the moving direction of the X-Y manipulator 8 so as to form irradiation areas 2a, 2b, 2c, and 2d.

At the time, even if the bubble 1a is generated by the prior shot of the laser light 12, the movement distance d of the bubble 1a is larger than the maximum move range between the successive two laser shots. Accordingly, the bubble 1a does not interfere with the subsequent shot. Therefore it is possible to perform laser doping with the impurity elements doped with desired concentration and desired depth. It is also possible to design the method for manufacturing a semiconductor device by using the impurity-doping method according to the second embodiment, in a similar manner to the impurity-doping method according to the first embodiment.

Other Embodiments

The present invention is explained based on the foregoing disclosed embodiments. However, it is should not be understood that the statements and drawings included in the disclosure limit the present invention. It should be considered that the disclosure reveals various substitute embodiments, examples, and application technologies to a person skilled in the art.

For example, in the impurity-doping method according to the aforementioned first and second embodiments, the values of the scanning velocity Vs, characteristic dimension L of irradiation areas, overlapping ratio c, and radius r of bubbles are determined in advance. And then, the minimum movement distance is calculated, using Eq. (1) and Eq. (2) in accordance with the angle θ. Then, in accordance with the calculated minimum movement distance, the flow rate Vf of the liquid 4 to be moved at laser doping is performed.

However, the determining of the scanning velocity Vs, characteristic dimension L, overlapping ratio c, and radius r of bubbles can be changed to values suitable for laser doping. Eq. (1) and Eq. (2) can be used at the determining.

As described so far, the present invention includes various embodiments that are not described above, and the technical scope of the invention is defined only by a matter specifying the invention according to the reasonable scope of patent claims based on the foregoing explanation.

What is claimed is:

1. A method for doping impurities, comprising:
   determining a flow rate of a liquid and a scanning velocity of light pulses, by which a surface of a semiconductor substrate is scanned, by:
     a characteristic dimension of irradiation area of the light pulses scanned and irradiated into the liquid, which contains impurity elements and moves on a surface of the semiconductor substrate at a fixed flow rate, the characteristic dimension being along a flow direction of the liquid,
     an overlapping ratio, which is a ratio of a length, of an area overlapping between a prior and a subsequent irradiation area, in a scanning direction of the light pulses to a length of the irradiation area in the scanning direction, and
     a radius of a bubble generated in the liquid; and
   transporting the liquid on the surface of the semiconductor substrate at the determined flow rate while scanning and irradiating the light pulses onto the surface of the semiconductor substrate through the liquid at the determined scanning velocity to dope the impurity elements into a part of the inside of the semiconductor substrate.

2. The method of claim 1, wherein the determining flow rate of the liquid includes:
   calculating the minimum movement distance that the bubble moves along the flow direction of the liquid through the characteristic length, the overlapping ratio, the radius of the bubble, the angle between the scanning direction and the movement direction of the bubble within a repetition period of a sequence of two shots of the light pulse, the light pulses are irradiated into the liquid in scanning, the bubble is generated by a prior shot of the two shots;
   calculating the minimum value of flow rate of the liquid, which is needed for the bubble to move the minimum movement distance; and
   determining the flow rate of the liquid to a value larger than the calculated minimum value.

3. The method of claim 2, wherein the calculating the minimum value of flow rate of the liquid is implemented through using a movement velocity of the bubble calculated in combination of the flow rate of the liquid and the scanning velocity.

4. The method of claim 3, wherein the calculating the minimum movement distance is implemented so that the minimum movement distance includes the radius of the bubble.

5. The method of claim 4, wherein the shape of the irradiation area is rectangle, the scanning direction is along the short side of the rectangle.

6. The method of claim 5, wherein the light pulses are scanned and irradiated in which the flow direction of the liquid is set orthogonal to the scanning direction at reciprocating scanning.

7. A method for manufacturing a semiconductor device, comprising:
   determining a flow rate of a liquid and a scanning velocity of light pulses, by which a surface of a semiconductor substrate is scanned, by:
     a characteristic dimension of irradiation area of the light pulses scanned and irradiated into the liquid, which contains impurity elements and moves on a surface of the semiconductor substrate at a fixed flow rate, the characteristic dimension being along a flow direction of the liquid,
     an overlapping ratio, which is a ratio of a length, of an area overlapping between a prior and a subsequent irradiation area, in a scanning direction of the light pulses to a length of the irradiation area in the scanning direction, and
     a radius of a bubble generated in the liquid; and
   forming a semiconductor region by transporting the liquid on the surface of the semiconductor substrate at the determined flow rate while scanning and irradiating the light pulses onto the surface of the semiconductor substrate through the liquid at the determined scanning velocity to dope the impurity elements into a part of the inside of the semiconductor substrate.

8. The method of claim 7, wherein the determining flow rate of the liquid includes:
   calculating the minimum movement distance that the bubble moves along the flow direction of the liquid through the characteristic length, the overlapping ratio, the radius of the bubble, the angle between the scanning direction and the movement direction of the bubble within a repetition period of a sequence of two shots of the light pulse, the light pulses are irradiated into the liquid in scanning, the bubble is generated by a prior shot of the two shots;
   calculating the minimum value of flow rate of the liquid, which is needed for the bubble to move the minimum movement distance; and
   determining the flow rate of the liquid to a value larger than the calculated minimum value.

9. The method of claim 8, wherein the calculating the minimum value of flow rate of the liquid is implemented through using a movement velocity of the bubble calculated in combination of the flow rate of the liquid and the scanning velocity.

10. The method of claim 9, wherein the calculating the minimum movement distance is implemented so that the minimum movement distance includes the radius of the bubble.

11. The method of claim 10, wherein the shape of the irradiation area is rectangle, the scanning direction is along the short side of the rectangle.

12. The method of claim 11, wherein the light pulses are scanned and irradiated in which the flow direction of the liquid is set orthogonal to the scanning direction at reciprocating scanning.

* * * * *